United States Patent
Lin et al.

(10) Patent No.: US 8,587,001 B2
(45) Date of Patent: Nov. 19, 2013

(54) LIGHT-EMITTING DIODE LIGHT MODULE FREE OF JUMPER WIRES

(75) Inventors: Chin-Lung Lin, Taipei (TW); Yen-Chang Tu, Taipei (TW); Pai-Ti Lin, Taipei (TW); Che-Chang Hu, Taipei (TW)

(73) Assignee: Unistar Opto Corporation, Taipei (TW)

( * ) Notice: Subject to any disclaimer, the term of this patent is extended or adjusted under 35 U.S.C. 154(b) by 46 days.

(21) Appl. No.: 13/371,993

(22) Filed: Feb. 13, 2012

(65) Prior Publication Data

US 2013/0207128 A1 Aug. 15, 2013

(51) Int. Cl.
- H01L 29/18 (2006.01)
- H01L 27/15 (2006.01)
- H01L 33/00 (2010.01)
- H01L 23/02 (2006.01)
- H01L 23/48 (2006.01)
- H01L 21/00 (2006.01)

(52) U.S. Cl.
USPC ............... 257/88; 257/81; 257/99; 257/678; 257/690; 257/735; 257/773; 257/E33.056; 257/E33.057; 257/E33.062; 257/E33.065; 438/26; 438/27; 438/28; 438/108

(58) Field of Classification Search
None
See application file for complete search history.

(56) References Cited

U.S. PATENT DOCUMENTS

| | | | | |
|---|---|---|---|---|
| 6,393,183 | B1 * | 5/2002 | Worley | 385/39 |
| 2006/0113555 | A1 * | 6/2006 | Yang | 257/99 |
| 2011/0133337 | A1 * | 6/2011 | Shau | 257/738 |
| 2012/0074441 | A1 * | 3/2012 | Seo et al. | 257/91 |
| 2012/0211783 | A1 * | 8/2012 | Horng et al. | 257/93 |

* cited by examiner

*Primary Examiner* — Julio J. Maldonado
*Assistant Examiner* — Harpreet Singh
(74) *Attorney, Agent, or Firm* — C. G. Mersereau; Nikolai & Mersereau, P.A.

(57) ABSTRACT

An LED light module free of jumper wires has a substrate and multiple LED chips. The substrate has a positive side circuit, a negative side circuit, multiple first chip connection portions and multiple second connection portions. The first and second chip connection portions are respectively connected to the positive and negative side circuits, and are juxtaposedly and alternately arranged on the substrate so that a width between each first chip connection portion and a corresponding second chip connection portion is smaller than a width of each LED chip. Each LED chip can be directly mounted on corresponding first and second chip connection portions to electrically connect to the positive and negative side circuits. Accordingly, jumper wires for connecting the LED chips and the positive and negative side circuits can be removed to avoid broken jumper wires occurring when the LED light module is shipped or assembled.

4 Claims, 8 Drawing Sheets

US 8,587,001 B2

LIGHT-EMITTING DIODE LIGHT MODULE FREE OF JUMPER WIRES

BACKGROUND OF THE INVENTION

1. Field of the Invention

The present invention relates to a light-emitting diode (LED) light module, and more particularly to an LED light module having no jumper wires connected to LED chips and avoiding the issue of broken jumper wires when the LED light module is compressed or collides.

2. Description of the Related Art

In view of rapid development of LEDs, LEDs have gradually replaced conventional light bulbs to become lighting elements of light sources for most lighting-related equipment. As light transmitted by LED transistors has high directivity, a conventional LED light module is built to have single or multiple LED chips embedded in optically-transmissive adhesive in generation of a uniform lighting effect through the optically-transmissive adhesive, so as to form a point light source or an area light source ideal for lighting equipment. The LED light module having a single LED chip is called an LED point light module. The LED light module having multiple LED chips is called an LED area light module.

With reference to FIGS. 7 and 8, each conventional LED light module has a substrate 70, multiple LED chips 80, a frame 90, and an optically-transmissive adhesive layer 91.

The substrate 70 has a positive side circuit 71, a negative side circuit 72 and a solder mask layer 73 formed on the substrate 70. The solder mask layer 73 partially masks the positive side circuit 71 and the negative side circuit 72 so that the exposed portions of the positive side circuit 71 and the negative side circuit 72 form multiple electrical contacts 711, 721.

At least one LED chip 80 is securely mounted on the solder mask layer 73 of the substrate 70, and two metal jumper wires 81 mounted on the at least one LED chip 80 are electrically connected to the respective electrical contacts 711, 721 of the positive side circuit 71 and the negative side circuit 72.

The frame 90 is mounted on the solder mask layer 73 of the substrate 70 to surround the at least one LED chip 80. An optically-transmissive adhesive layer 91 is formed within the frame 90 to cover the at least one LED chip 80.

In order not to block light emitted from the at least one LED chip 80, the LED light module employs the metal jumper wires 81 having thin wire diameter. However, with reference to FIG. 9, as the hardness of the optically-transmissive adhesive layer 91 is low, the metal jumper wires 81 inside the optically-transmissive adhesive layer 91 are easily broken when the LED light module is shipped or assembled into a lamp and the optically-transmissive adhesive layer 91 is inadvertently squeezed. Hence, the LED chip 80 connected to the broken metal jumper wires 81 fails to function and emit light and the LED light module becomes defective goods. Moreover, the LED light module is unable to be depackaged to fix the broken jumper wires 81. Therefore, manufacturer of the LED light module cannot help discarding the entire defective LED light module.

SUMMARY OF THE INVENTION

An objective of the present invention is to provide an LED light module free of jumper wires for avoiding broken jumper wires easily occurring during delivery and assembly of the LED light module.

To achieve the foregoing objective, the LED light module has a substrate, at least one LED chip, a frame and an optically-transmissive adhesive layer.

The substrate has a positive side circuit, a negative side circuit, at least one first chip connection portion, at least one second chip connection portion and a solder mask layer.

The positive side circuit is formed on a surface of the substrate.

The negative side circuit is formed on the surface of the substrate.

The at least one first chip connection portion is juxtaposedly formed on the surface of the substrate and connected to the positive side circuit.

The at least one second chip connection portion is juxtaposedly formed on the surface of the substrate and connected to the negative side circuit. The at least one second chip connection portion and the at least one first chip connection portion are alternately arranged on the substrate in a longitudinal direction of the substrate. Each one of the at least one second chip connection portion and a corresponding one of the at least one first chip connection portion are spaced with a first gap.

The solder mask layer is formed on and partially covers the at least one first chip connection portion and the at least one second chip connection portion for the at least one first chip connection portion and the at least one second chip connection portion to be partially exposed to respectively form multiple electrical contacts thereon.

A width of each one of the at least one LED chip is wider than the first gap between a corresponding one of the at least one first chip connection portion and a corresponding one of the at least one second chip connection portion. Each one of the at least one LED chip is mounted on the electrical contact of a corresponding one of the at least one first chip connection portion and on the electrical contact of a corresponding one of the at least one second chip connection portion.

The frame is mounted on the substrate to surround the at least one LED chip.

The optically-transmissive adhesive layer is mounted within the frame to cover and contain the at least one LED chip therein.

The at least one LED chip of the aforementioned LED light module can be directly mounted on the electrical contacts respectively formed on the exposed portions of the first and second chip connection portions to electrically connect to the positive and negative side circuits respectively through the corresponding first and second chip connection portions. Therefore, the issues of broken jumper wires of the LED light module arising from shipment and assembly of the LED light module and light emitted from the at least one LED chip and blocked by the jumper wires can be eliminated.

Alternatively, the LED light module has a substrate, multiple LED chips, a frame and an optically-transmissive adhesive layer.

The substrate has a positive side circuit, a negative side circuit, a first chip connection portion, a second chip connection portion, at least one third chip connection portion and a solder mask layer.

The positive side circuit is formed on a surface of the substrate.

The negative side circuit is formed on the surface of the substrate.

The first chip connection portion is formed on the surface of the substrate and connected to the positive side circuit.

The second chip connection portion is formed on the surface of the substrate and connected to the negative side circuit, and faces the first chip connection portion.

The at least one third chip connection portion is juxtaposedly formed on the substrate and between the first chip connection portion and the second chip connection portion in a longitudinal direction of the substrate with a gap between each adjacent two of the at least one third chip connection portion. The first chip connection portion and the third chip connection portion are spaced with the gap on one end of the at least one third chip connection portion in the longitudinal direction. The second chip connection portion and the third chip connection portion are spaced with the gap on the other end of the at least one third chip connection portion.

The solder mask layer is formed on and partially covers the first chip connection portion, the second chip connection portion and the at least one third chip connection portion for the first chip connection portion and the second chip connection portion to be partially exposed to respectively form two electrical contacts thereon and for each one of the at least one third chip connection portion to be partially exposed to form two opposite electrical contacts thereon in the longitudinal direction of the substrate.

A width of each LED chip is wider than the gap. Each LED chip is directly mounted on the electrical contact of the first chip connection portion and the electrical contact of a corresponding third chip connection portion adjacent to the first chip connection portion, on the electrical contact of the second chip connection portion and the electrical contact of a corresponding third chip connection portion adjacent to the second chip connection portion, or on the two electrical contacts of two corresponding adjacent third chip connection portions facing each other so that the LED chips are serially and electrically connected through the at least one third chip connection portion and are further electrically connected to the positive side circuit and the negative side circuit respectively through the first and second chip connection portions.

The frame is mounted on the substrate to surround the LED chips.

The optically-transmissive adhesive layer is mounted within the frame to cover and contain the LED chips therein.

The LED chips of the aforementioned LED light module are serially connected through the at least one third chip connection portion to electrically connect to the positive and negative side circuits respectively through the corresponding first and second chip connection portions. Likewise, the issues of broken jumper wires of the LED light module arising from shipment and assembly of the LED light module and light emitted from the at least one LED chip and blocked by the jumper wires can be eliminated.

Other objectives, advantages and novel features of the invention will become more apparent from the following detailed description when taken in conjunction with the accompanying drawings.

DETAILED DESCRIPTION OF THE INVENTION

Figure 1:
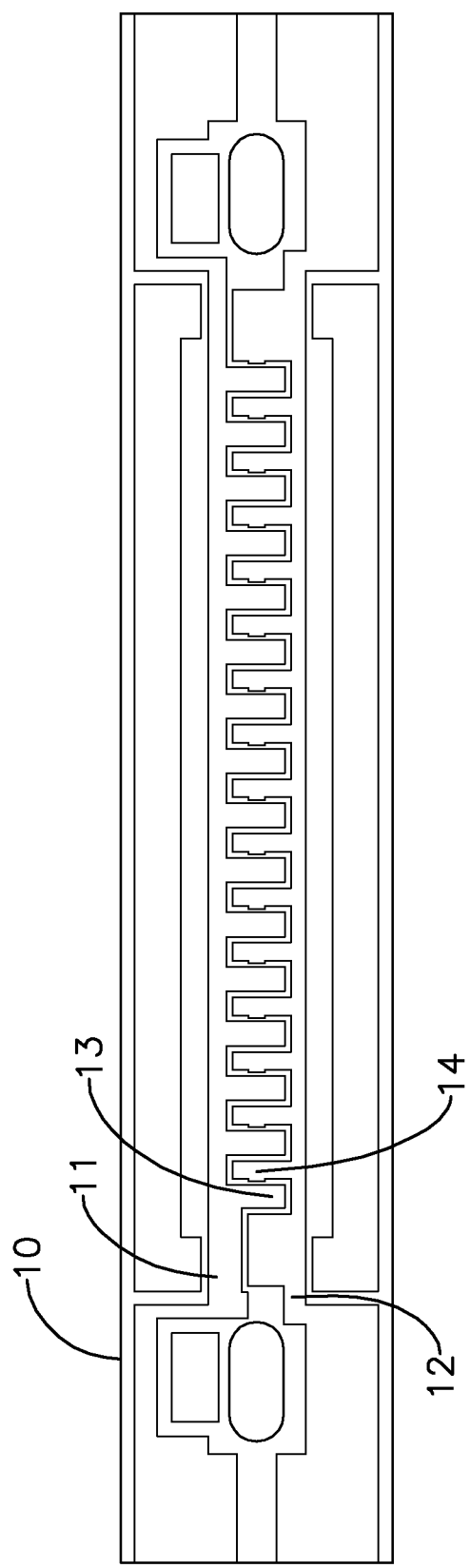
FIG. 1 is a top view of a first embodiment of an LED light module free of jumper wires having no LED chips, optically-transmissive adhesive layer and frame in accordance with the present invention.
Figure 2:
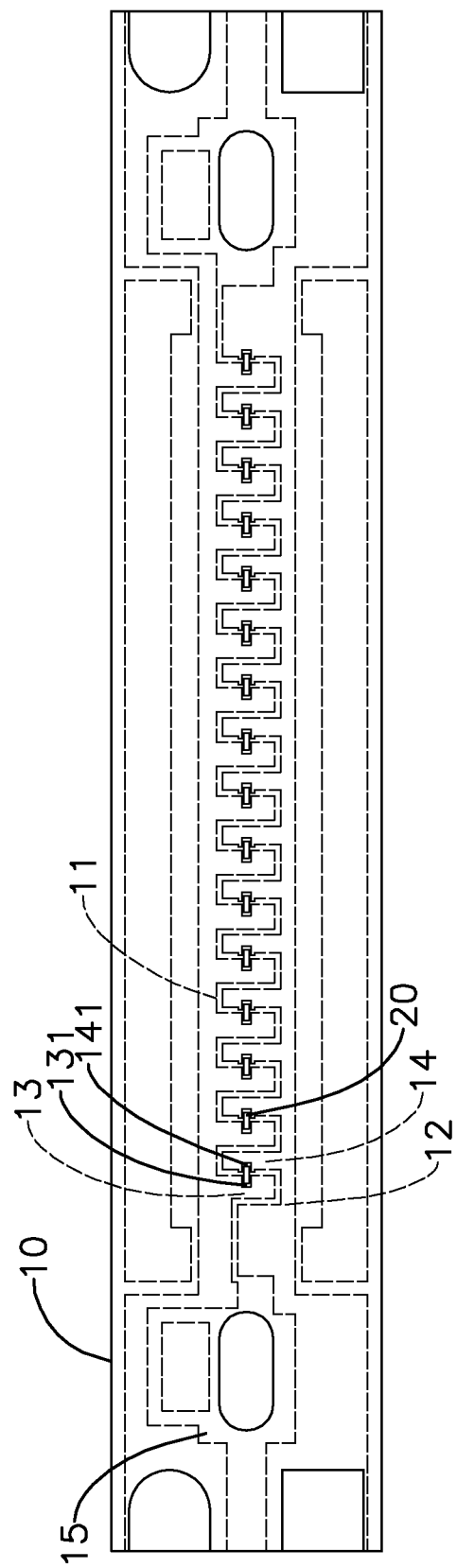
FIG. 2 is a top view of the LED light module in FIG. 1 further having multiple LED chips mounted thereon.
Figure 3:
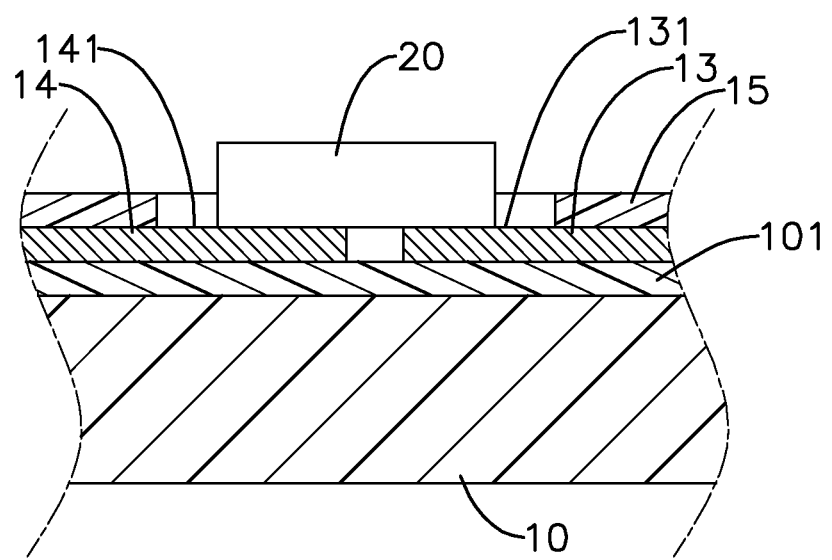
FIG. 3 is a side view in partial section of the LED light module in FIG. 2.
Figure 4:
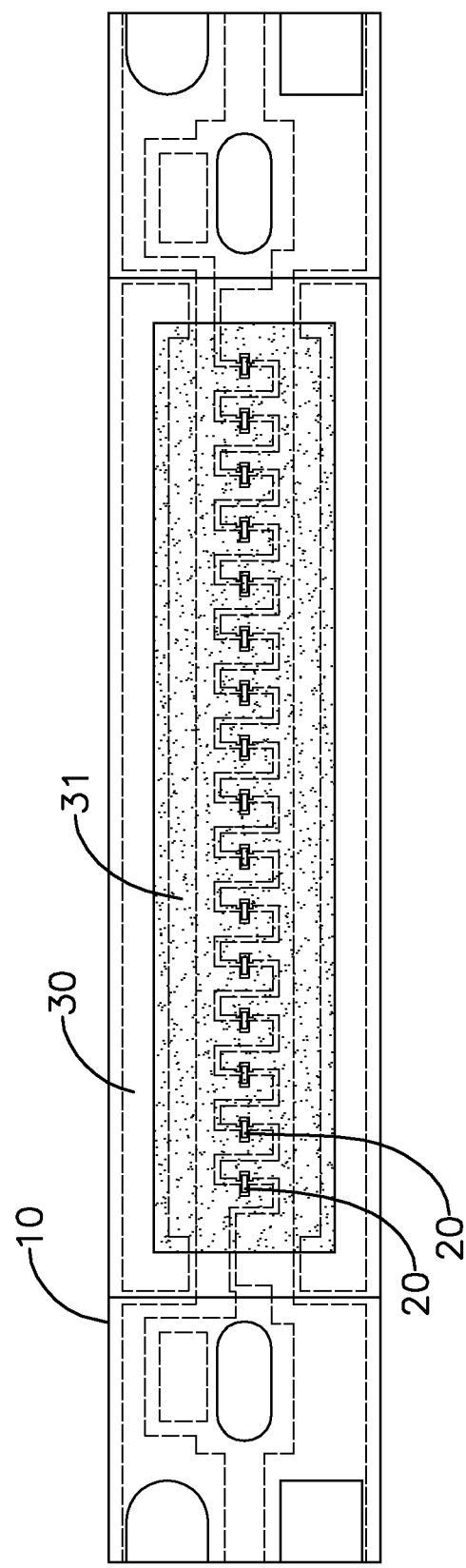
FIG. 4 is a top view of the LED light module in FIG. 2 further having a frame and an optically-transmissive adhesive layer.
Figure 5:
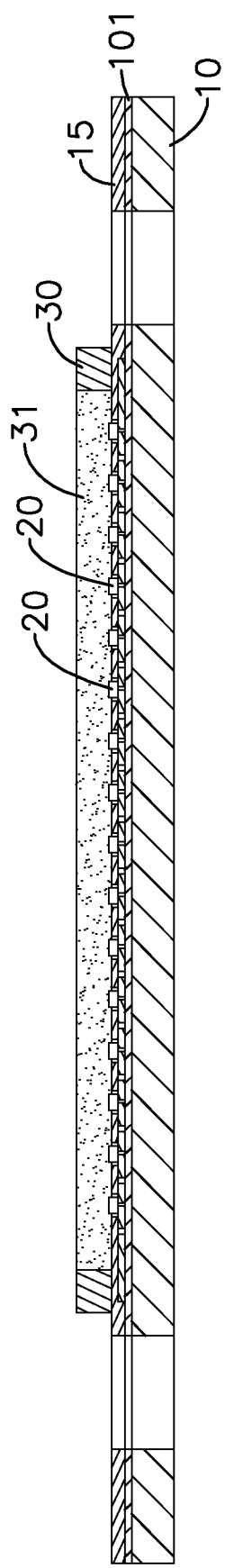
FIG. 5 is a cross-sectional view of the LED light module in FIG. 4.

With reference to FIGS. 1 to 5, an LED light module free of jumper wires in accordance with the present invention has a substrate 10, a solder mask layer 15, at least one LED chip 20, a frame 30 and an optically-transmissive adhesive layer 31.

The substrate 10 has a positive side circuit 11, a negative side circuit 12, at least one first chip connection portion 13 and at least one second chip connection portion 14 formed on a surface of the substrate 10. The at least one first chip connection portion 13 is juxtaposedly formed and connected to the positive side circuit 11. The at least one second chip connection portion 14 is juxtaposedly formed on and connected to the negative side circuit 12 and the at least one second chip connection portion 14 and the first chip connection portion 13 are alternately arranged on the substrate 10 in a longitudinal direction of the substrate 10. Each one of the at least one second chip connection portion 14 and a corresponding first chip connection portion 13 are spaced with a gap.

The solder mask layer 15 is formed on and partially covers the at least one first chip connection portion 13 and the at least one second chip connection portion 14 for the at least one first chip connection portion 13 and the at least one second chip connection portion 14 to be partially exposed to respectively form multiple electrical contacts 131, 141 thereon. In the present embodiment, the LED light module has multiple first chip connection portions 13 and multiple second chip connection portions 14. The positive side circuit 11 and the negative side circuit 12 are parallel to the substrate in a longitudinal direction. The first chip connection portions 13 are juxtaposedly formed on the substrate 10 and connected to the positive side circuit 11. The second chip connection portions 14 are juxtaposedly formed on the substrate 10 and connected to the negative side circuit 12. A gap between each adjacent two of the first chip connection portions 13 is wider than a width of each second chip connection portion 14 and than a gap between each first chip connection portion 13 and the adjacent second chip connection portion 14 so that each second chip connection portion 14 is receivable within the gap between two adjacent first chip connection portions 13.

A width of each one of the at least one LED chip 20 is wider than the gap between a corresponding first chip connection portions 13 and a corresponding second chip connection portions 14. Each one of the at least one LED chip 20 is mounted on the electrical contact 131 of a corresponding first chip connection portion 13 and on the electrical contact 141 of a corresponding second chip connection portion 14. In the present embodiment, the LED light module has multiple LED chips 20. Each LED chip 20 is securely mounted on a corresponding first chip connection portion 13 and a corresponding second chip connection portion 14 adjacent to each other.

The frame 30 is mounted on the substrate to surround the LED chips 20. The optically-transmissive adhesive layer 31 is mounted within the frame 30 to cover the LED chips and contain the LED chips 20 therein.

The substrate 10 also serves to dissipate heat generated by the LED chips 20, and may be made of aluminum, copper, ceramic or copper foils (FR4). The substrate 10 further has an insulation layer 101 for the positive and negative side circuits 11, 12 and the first and second chip connection portions 13, 14 to be formed on the insulation layer 101.

Each first chip connection portion 13 connected to the positive side circuit 11 and adjacent one of the second chip connection portions 14 connected to the negative side circuit 12 are juxtaposedly spaced with a gap less than the width of each one of the at least one LED chip 20. Each one of the at least one LED chip 20 is directly mounted on one of the first chip connection portions 13 and a corresponding second chip connection portion 14 adjacent to the first chip connection portion 13 so as to electrically connect the positive side circuit 11 and the negative side circuit 12 without the use of any metal jumper wire.

Figure 6:
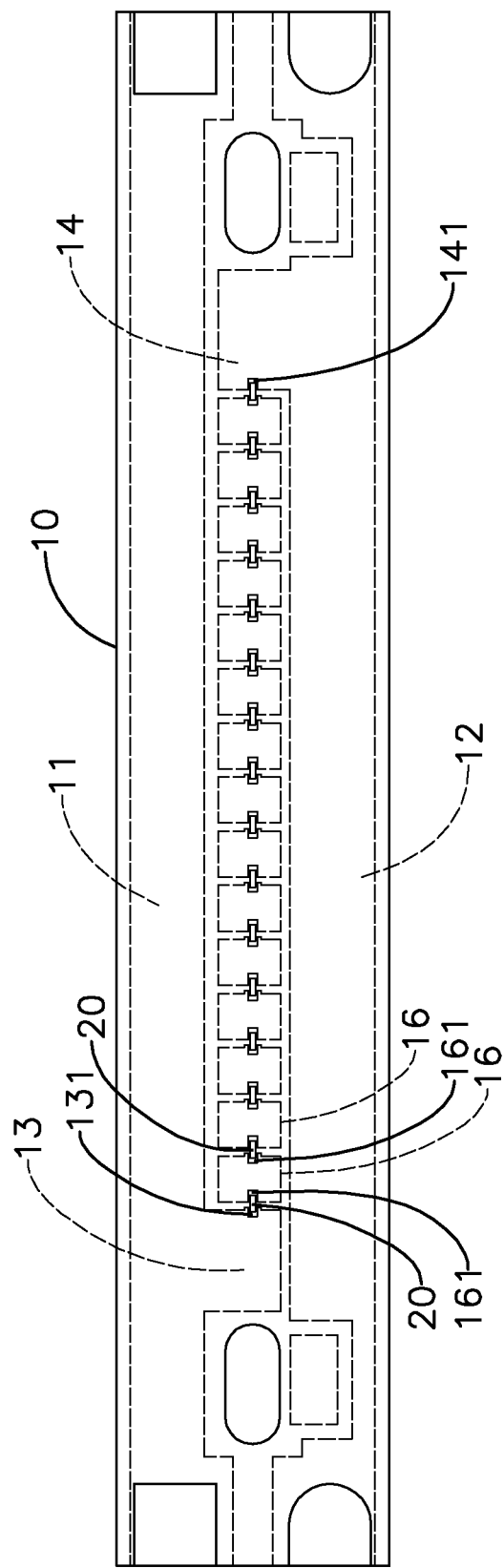
FIG. 6 is a top view of a second embodiment of an LED light module free of jumper wires having multiple LED chips mounted thereon in accordance with the present invention.
Figure 7:
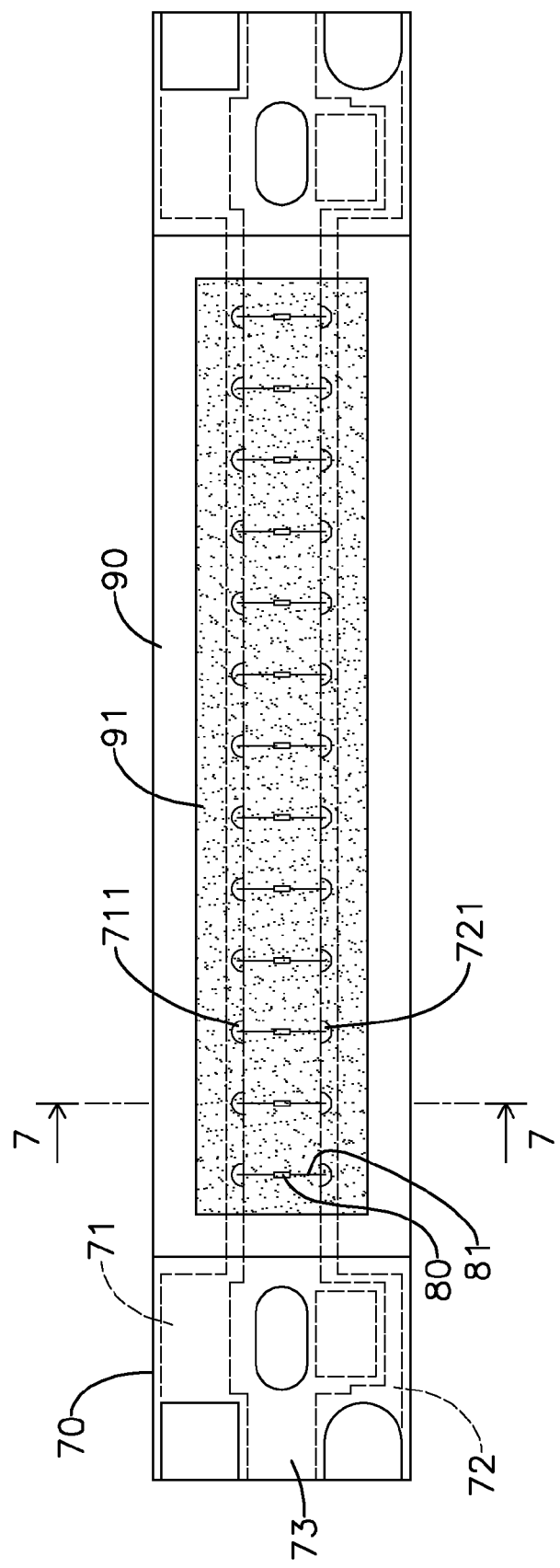
FIG. 7 is a top view of a conventional LED light module.
Figure 8:
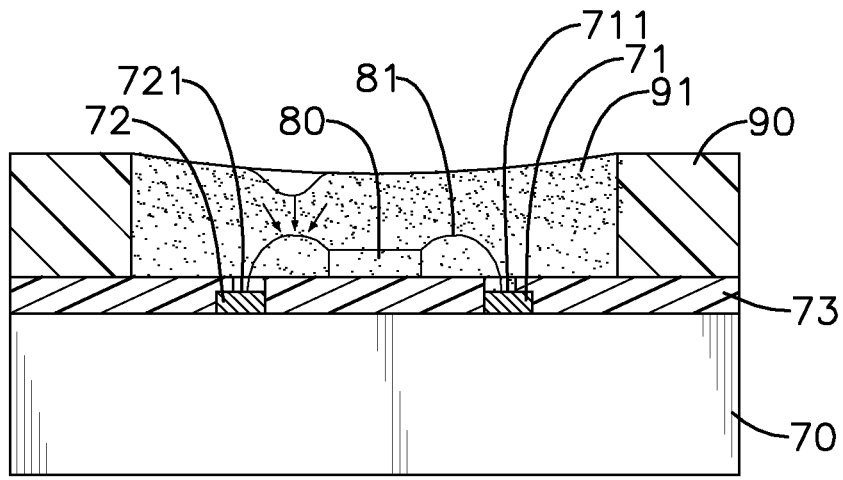
FIG. 8 is a cross-sectional view of the conventional LED light module subjected to a compression force.
Figure 9:
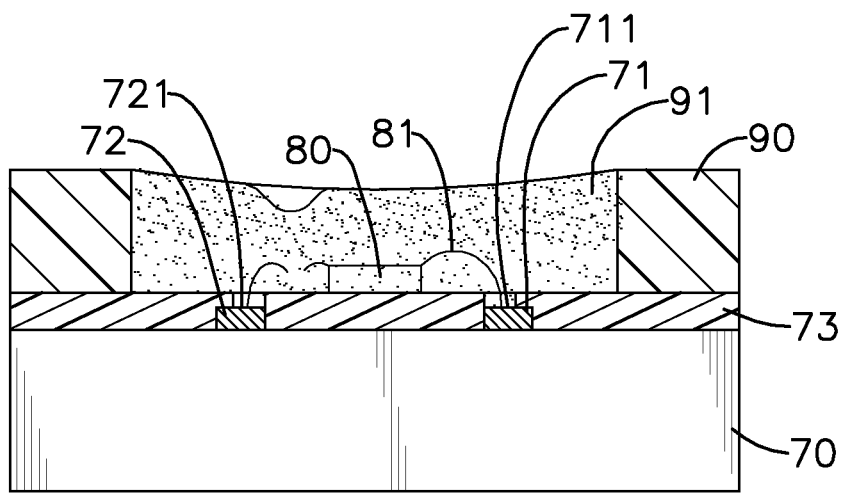
FIG. 9 is a cross-sectional view of the conventional LED light module having a broken jumper wire.

To compare with the LED light module having the LED chips parallelly connected in the foregoing embodiment, the following embodiment illustrates an LED light module having multiple LED chips serially connected. With reference to FIG. 6, a second embodiment of an LED light module free of jumper wires in accordance with the present invention is illustrated. The substrate 10 of the LED light module has a first chip connection portion 13, a second chip connection portion 14 and at least one third chip connection portion 16. The first and second chip connection portions 13, 14 are formed on the substrate 10, are respectively connected to the positive side circuit 11 and the negative side circuit 12, and face each other. The at least one third chip connection portion 16 is juxtaposedly formed on the substrate 10 and between the first chip connection portion 13 and the second chip connection portion 14 in the longitudinal direction of the substrate 10 with a gap between each adjacent two of the at least one third chip connection portion 16. The first chip connection portion 13 and the third chip connection portion 16 are spaced with a gap on one end of the third chip connection portions 16 in the longitudinal direction, and the second chip connection portion 14 and the third chip connection portion 16 are spaced with a gap on the other end of the third chip connection portions 16. Each third chip connection portion 16 is partially exposed from the solder mask layer 15 to form two opposite electrical contacts 161 thereon in the longitudinal direction of the substrate 10. In the present embodiment, the LED light module has multiple third chip connection portions 16. The third chip connection portions 16 are arranged between the first chip connection portion 13 and the second chip connection portion 14 and are formed on the insulation layer 101 of the substrate 10.

Each LED chip 20 is directly mounted on the electrical contact of the first chip connection portion 13 and the electrical contact of a corresponding third chip connection portion 16 adjacent to the first chip connection portion 13, on the electrical contact of the second chip connection portion 14 and the electrical contact of a corresponding third chip connection portion 16 adjacent to the second chip connection portion 14, or on the two electrical contacts of two corresponding adjacent third chip connection portions 16 facing each other, so that the LED chips 20 are serially and electrically connected through the at least one third chip connection portion 16 and are further electrically connected to the positive side circuit 11 and the negative side circuit 12 respectively through the first and second chip connection portions 13, 14. In the present embodiment, the LED light module has multiple third chip connection portions 16. The LED chips 20 are respectively mounted on the electrical contacts of the third chip connection portions 16 and are serially and electrically connected through the third chip connection portions 16. Hence, the LED chips 20 can also be directly mounted on the first, second and third chip connection portions 13, 14, 16 without the use of metal jumper wires.

The LED chips 20 can be electrically connected to the first and second chip connection portions 13,14 of the positive side circuit 11 and the negative side circuit 12 and the third chip connection portion 16. Accordingly, not only can broken jumper wires be avoided, but also the issue that light emitted by the at least one LED chip 20 is blocked by the jumper wires can also be eliminated, thereby reducing the damage caused when shipping and assembling the LED light module and the light blockage.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A light-emitting diode (LED) light module free of jumper wires comprising:
    a substrate having:
    a positive side circuit formed on a surface of the substrate;
    a negative side circuit formed on the surface of the substrate;
    at least one first chip connection portion juxtaposedly formed on the surface of the substrate and connected to the positive side circuit;
    at least one second chip connection portion juxtaposedly formed on the surface of the substrate and connected to the negative side circuit, wherein the at least one second chip connection portion and the at least one first chip connection portion are alternately arranged on the substrate in a longitudinal direction of the substrate, and each one of the at least one second chip connection portion and a corresponding one of the at least one first chip connection portion are spaced with a first gap; and
    a solder mask layer formed on and partially covering the at least one first chip connection portion and the at least one second chip connection portion for the at least one first chip connection portion and the at least one second chip connection portion to be partially exposed to respectively form multiple electrical contacts thereon;
    at least one LED chip, wherein a width of each one of the at least one LED chip is wider than the first gap between a corresponding one of the at least one first chip connection portion and a corresponding one of the at least one second chip connection portion, and each one of the at least one LED chip is mounted on the electrical contact of a corresponding one of the at least one first chip connection portion and on the electrical contact of a corresponding one of the at least one second chip connection portion;
    a frame mounted on the substrate to surround the at least one LED chip; and
    an optically-transmissive adhesive layer mounted within the frame to cover and contain the at least one LED chip therein.

2. The LED light module as claimed in claim 1 comprising multiple first chip connection portions and multiple second chip connection portions, wherein
    the positive side circuit and the negative side circuit are parallel to the longitudinal direction of the substrate;
    the first chip connection portions are juxtaposedly formed on the surface of the substrate and connected to the positive side circuit;

the second chip connection portions are juxtaposedly formed on the surface of the substrate and connected to the negative side circuit;

the second chip connection portions and the first chip connection portions are alternately arranged on the substrate in the longitudinal direction of the substrate;

each second chip connection portion and a corresponding first chip connection portion are spaced with the first gap; and a second gap between each adjacent two of the first chip connection portions is wider than a width of each second chip connection portion and than the first gap between each first chip connection portion and the adjacent second chip connection portion.

3. The LED light module as claimed in claim 1, wherein the substrate is made of aluminum, copper, ceramic or copper foils and further has an insulation layer for the positive side circuit, the negative side circuit, the first chip connection portions and the second chip connection portions to be formed on the insulation layer.

4. The LED light module as claimed in claim 2, wherein the substrate is made of aluminum, copper, ceramic or copper foils and further has an insulation layer for the positive side circuit, the negative side circuit, the first chip connection portions and the second chip connection portions to be formed on the insulation layer.

* * * * *